(12) United States Patent
Abe et al.

(10) Patent No.: US 7,522,644 B2
(45) Date of Patent: Apr. 21, 2009

(54) LASER OSCILLATOR

(75) Inventors: Hiroko Abe, Tokyo (JP); Satoshi Seo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 5 days.

(21) Appl. No.: 11/293,511

(22) Filed: Dec. 5, 2005

(65) Prior Publication Data

US 2006/0133438 A1 Jun. 22, 2006

(30) Foreign Application Priority Data

Dec. 6, 2004 (JP) .............................. 2004-353451

(51) Int. Cl.
*H01S 3/14* (2006.01)
(52) U.S. Cl. ..................................... 372/39; 372/43.01
(58) Field of Classification Search ................ 372/39
See application file for complete search history.

(56) References Cited

U.S. PATENT DOCUMENTS

| 6,160,828 A | 12/2000 | Kozlov et al. |
| 6,621,840 B2 * | 9/2003 | Araki ........................... 372/39 |
| 6,687,266 B1 * | 2/2004 | Ma et al. ....................... 372/7 |
| 6,879,618 B2 * | 4/2005 | Cok et al. ..................... 372/70 |
| 7,239,081 B2 | 7/2007 | Tsutsui |
| 2004/0265253 A1 | 12/2004 | Seo et al. |
| 2006/0159144 A1 | 7/2006 | Yukawa |

OTHER PUBLICATIONS

Nir Tessler, "Lasers Based on Semiconducting Organic Materials," Adv. Mater., 1999, 11, No. 5, pp. 363-370.

* cited by examiner

*Primary Examiner*—Minsun Harvey
*Assistant Examiner*—Kinam Park
(74) *Attorney, Agent, or Firm*—Eric J. Robinson; Robinson Intellectual Property Law Office, P.C.

(57) ABSTRACT

A laser oscillator is disclosed by means of current excitation by using a light-emitting element containing an organic matter. The present invention is a semiconductor device oscillating laser by current excitation comprising a light-emitting element having a laminated body which is formed by stacking sequentially a first layer made from an organic matter, a second layer containing an organic matter and a metal compound, and a third layer made from an organic matter interposed; and a first electrode and a second electrode formed over a substrate, the electrodes interposing the laminated body therebetween; wherein the organic matter contained in the second layer includes at least a light-emitting material.

22 Claims, 3 Drawing Sheets

US 7,522,644 B2

LASER OSCILLATOR

BACKGROUND OF THE INVENTION

1. Field of the Invention

The present invention relates to laser equipment employing a light-emitting element made from a material containing an organic mater, and more particularly such a current excitation organic laser oscillator.

2. Related Art

Solid laser has characteristics of high output, high efficiency, high energy storage properties, wide wavelength variable characteristics, and being small, and so the solid layer has a wide application field. Among all, semiconductor laser has main features of being small, lightweight, and having a small threshold value. Semiconductor laser employing inorganic semiconductor had already been developed and put into practice in many fields.

If laser oscillation employing an organic compound is realized, characteristics which cannot be obtained from inorganic semiconductor laser can be given the laser employing an organic compound. The characteristics are the following: for example, flexible laser can be manufactured based on flexibility of a material, a manufacturing process can be simplified, costs can be reduced, and a manufacturing process is diverse (a vapor deposition method, a spin coating method, a printing method, a dip coating method, or the like can be applied), and the like. An outline of laser employing an organic compound material is compiled in a non patent document 1.

As a typical light-emitting element which makes a material containing an organic material emit light, a light-emitting element which emits light by applying an electric field is known. The element is composed of a material containing an organic material interposed between a pair of electrodes, and is formed by stacking functioning layers referred to as a hole transporting layer, a light-emitting layer, and an electron transporting layer. The element emits light by applying voltage between the electrodes to inject electrons and holes to the light-emitting layer. A range of wavelengths of light emission can be varied depending on kinds of materials used for the light-emitting layer or kinds of guest materials to be added.

Non patent document 1: Nir Tessler "quot; Lasers Based on Semiconducting Organic Materials", Adv. Mater., 1999, 11, p. 363-370

If laser is manufactured by using such the light-emitting element containing an organic material, the laser can be easily enlarged and manufacturing costs can be reduced. Current excitation laser can be easier controlled than light excitation laser, and so whole laser equipment can be downsized.

SUMMARY OF THE INVENTION

In view of the foregoing, it is an object of the present invention to provide a laser oscillator by means of current excitation by using a light-emitting element containing an organic material.

According to the present invention, a light-emitting layer at least containing a light-emitting material as an organic material is made to include a metal compound (oxides, sulfides, or the like) having a high refractive index in a light-emitting element containing an organic material to make a refractive index of the light-emitting layer higher than those of functioning layers interposing the light-emitting layer, consequently, a semiconductor device having a resonator structure for oscillating laser within the light-emitting layer can be provided.

The present invention is a semiconductor device oscillating laser by current excitation comprising a light-emitting element having a laminated body which is formed by stacking sequentially a first layer made from an organic material, a second layer containing an organic material and a metal compound, and a third layer made from an organic material interposed; and a first electrode and a second electrode formed over a substrate, the electrodes interposing the laminated body therebetween; wherein the organic material contained in the second layer includes at least a light-emitting material.

A semiconductor device oscillating a laser beam at a wavelength λ by current excitation comprising a light-emitting element having a laminated body which is formed by stacking sequentially a first layer made from an organic material, a second layer containing an organic material and a metal compound, and a third layer made from an organic material interposed; and a first electrode and a second electrode formed over a substrate, the electrodes interposing the laminated body therebetween; wherein the organic material contained in the second layer includes at least a light-emitting material, and a thickness $d_e$ of the second layer fulfills $d_e = m\lambda/2n_e$ (m is an integer of 1 or more) assuming that a refractive index of the second layer is $n_e$.

Further, each thickness $d_f$ of each of the first layer and/or the second layer fulfills $d_f = (2m-1)\lambda/4n_f$ assuming that each refractive index is $n_f$ in the foregoing constitutions.

The semiconductor device according to the present invention is a laser oscillator employing a light-emitting element containing an organic material, which can oscillate laser due to current excitation.

Further, the semiconductor device according to the present invention is a laser oscillator which can be easily enlarged.

These and other objects, features and advantages of the present invention will become more apparent upon reading of the following detailed description along with the accompanied drawings.

DESCRIPTION OF THE INVENTION

Figure 1:
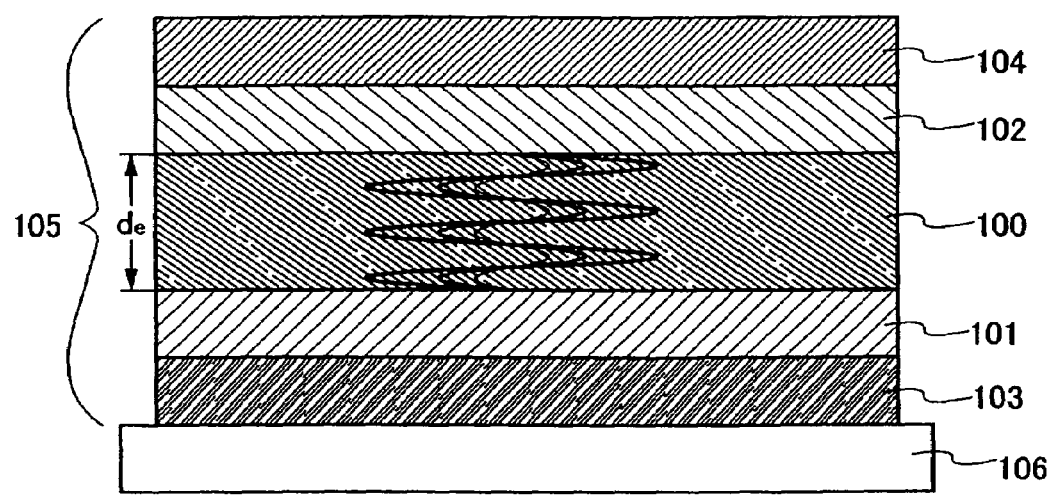
FIG. 1 is a cross-sectional schematic view of a laser oscillator according to the present invention.

The above and further objects and novel features of the invention will more fully appear from the following details description when the same is read in connection with the accompanying drawings. As the present invention may be embodied in several forms, it is to be understood that various changes and modifications will be apparent to those skilled in the art without departing from the spirit of essential characteristics of the present invention. Therefore, unless otherwise such changes and modifications depart from the scope of the present invention hereinafter described, they should be construed as being included therein.

An outline of a laser oscillator according to the present invention is explained with reference to FIG. 1. The laser oscillator according to the present invention is manufactured by forming a light-emitting element 105 composed of materials containing organic materials interposed between a pair of electrodes (a first electrode 103 and a second electrode 104) over a substrate 106, in which a light-emitting layer 100 containing a light-emitting substance in the light-emitting element is made to include a metal compound having a high refractive index (such as a metal oxide or a metal sulfide) to make the light-emitting layer 100 have a high refractive index as compared with the case that the metal compound is not included. The light-emitting layer 100 is interposed between functioning layers such as an electron injecting and transporting layer 101 and a hole injecting and transporting layer 102. Each of the functioning layers is made from an organic material. A refractive index of an organic material generally tends to be low. Organic materials have the same refractive index as each other. Therefore, the light-emitting layer 100 including a metal compound with a high refractive index has a higher refractive index than that of each functioning layer which interposes the light-emitting layer 100. Hence, light generated in the light-emitting layer 100 is reflected by an interface between the light-emitting layer 100 and each of the functioning layers (the electron injecting and transporting layer 101, the hole injecting and transporting layer 102).

In the light-emitting element 105 having such the structure, a resonator structure can be manufactured by setting a thickness $d_e$ of the light-emitting layer 100 as $d_e = m\lambda/(2n_e)$ (m is an integer of 1 or more, $n_e$ is a refractive index of the light-emitting layer) assuming that a wavelength of a desired laser beam is $\lambda$.

Current is applied to the light-emitting element 105 to obtain inverted population, induced excitation is occurred in the light-emitting layer 100, and light which is inductively excited due to the resonator structure by the light-emitting layer 100 is further amplified, then, a laser beam is oscillated.

According to the structure of the present invention, the resonator structure is provided by the light-emitting layer 100 for generating light emission, and so resonance is possible without light passing through an interface between the light-emitting layer and other layers. Therefore, a super-efficient laser oscillator with a few loss of light can be manufactured.

Since an element can be manufactured by a vapor deposition method or a wet method over a large substrate, costs for manufacturing one element is extremely low. Further, there is possibility of obtaining a large area laser beam since the element can be manufactured by the foregoing method.

The laser oscillator can be manufactured to be smaller since an optical source is not required than an optically-pumped organic laser. Further, the laser oscillator has high controllability.

An organic thin film is supplied with a large amount of carriers in such the light-emitting element. According to a rough estimate, the number of carriers presented in the element while applying current is approximately the same as the number of molecules in the light-emitting element, or the former is larger. Therefore, there is possibility that the number of molecules which have no carriers, that is, the number of molecules at a ground state is smaller than the number of molecules having carriers. In case that an excitation state is generated due to recombination of carriers in this state, there is possibility that the number of molecules at a ground state is relatively larger than the number of molecules at an excited state. That is, it can be predicted that low amount of current application is enough to produce inverted population. Here, a resonator structure can be given to the element. By making a thickness of an organic film serving as a resonator be integral multiple of a half wavelength, laser oscillation becomes possible by amplifying light due to induced radiation generated from an inverted population state and due to resonance.

When looking at correlation between current density and light emission intensity for the purpose of the possibility of laser oscillation from a light-emitting element, all or a part of the correlation between the current density and the light emission intensity are indicated by two direct lines with different gradients and a region of a large gradient is located at high current side with respect to a small gradient region. The current density at the two regions are contacted with each other (hereinafter, threshold value) is from several mA to several ten mA/cm$^2$, which is extremely small. Simultaneously, a half width of an emission spectrum is reduced by approximate 20% at around the threshold value, and so the laser oscillator has the same behavior as that of current excitation laser equipment even if using an organic compound as a medium by forming a certain plurality of organic compound layers so as to be in contact with each other.

Therefore, realization of a laser oscillator employing a light-emitting element including an organic material by means of current excitation will be influenced by the possibility of manufacturing an appropriate resonator structure.

Hereinafter, embodiments of the present invention are explained in detail with reference to the drawings.

Embodiment 1

In this embodiment, a structure which can emit laser light from a substrate side of laser equipment employing a light-emitting element formed by stacking an electrode layer and an organic material containing layer over a substrate is explained.

Figure 2:
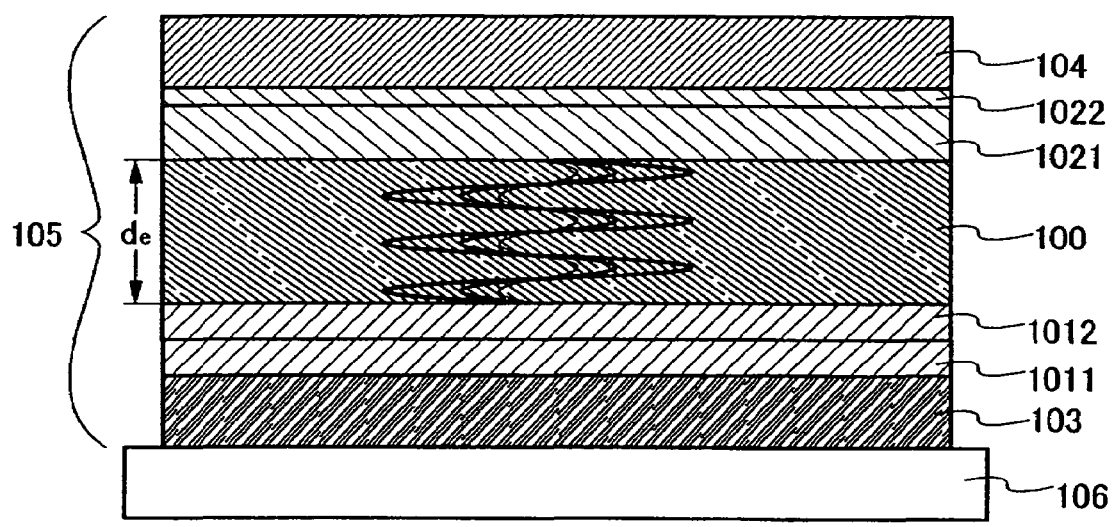
FIG. 2 is a cross-sectional schematic view of a laser oscillator according to the present invention.

FIG. 2 illustrates laser equipment according to this embodiment constituted by stacking a plurality of layers over a substrate 106. In this embodiment, any substrate having a light-transmitting property can be used as the substrate 106 since laser emission is extracted from a substrate side. Specifically, glass, quartz, transparent plastic, and the like can be used as the substrate 106.

Reference numeral 103 denotes a first electrode of the light-emitting element, whereas 104 denotes a second electrode of the light-emitting element. The light-emitting element emits light by applying high voltage to either of the electrodes. As the first electrode 103 and the second electrode 104, metal, alloy, an electric conductive compound, or a mixture of the foregoing materials can be used. The electrode supplied with higher voltage than that supplied to the other electrode in order to obtain light emission is made from a material having a high work function (4.0 eV or more). The other electrode supplied with lower voltage is made from a material having a small work function (3.8 eV or less). Since laser is output to the substrate side 106 in this embodiment, the first electrode 103 has preferably a light-transmitting property. Therefore, it is preferable that metal having a weak to absorption in a visible region is used, and the metal is formed into a thin film in the case of using metal or alloy.

In this embodiment, the first electrode 103 is supplied with higher voltage than that supplied to the other electrode. In that case, a transparent conductive oxide such as an indium tin oxide (ITO), a zinc oxide (ZnO), or a titanium nitride (TiN), or a nitride can be used. However, these materials absorb light to some extent, and so the electrode is preferably formed to be a thin film having a thickness of approximate 1000 nm or less.

An organic compound layer includes a hole injecting layer 1011 having a good hole injection property, a hole transporting layer 1012 for transporting efficiently holes from the hole injecting layer 1011 to a light-emitting layer 100, an electron injecting layer 1022 having a function of alleviating an electron injecting barrier, and an electron transporting layer 1021 for transporting efficiently injected electrons to the light-emitting layer. The injected carriers (holes and electrons) are recombined with each other in the light-emitting layer 100. The mechanism of the carrier injection, the carrier transportation, and the carrier recombination is like that of a general light-emitting element. Therefore, a material which can be used for a general light-emitting element can be used for each functioning layer except the light-emitting layer. In this embodiment, five functioning layers of the hole injecting layer 1011, the hole transporting layer 1012, the light-emitting layer 100, the electron injecting layer 1022, and the electron transporting layer 1021 are used as the organic compound layer. However, the present invention is not limited thereto. The number of functioning layers can be reduced to the extent of more than zero by forming one layer having a plurality of functions; in that case, another functioning layer may be additionally formed.

As the hole injecting material, materials having small ionization potential, which are classified broadly into low molecular organic compounds and high molecular compounds, are used. As examples of the low molecular organic compounds, starburst amine as typified by 4,4',4''-tris[N-(3-methylphenyl)-N-phenylamino]triphenylamine (hereinafter, m-MTDATA), metallophthalocyanine, and the like can be used. As examples of the high molecular compounds, conjugated polymer such as polyaniline or polythiophene derivatives can be nominated. By using the foregoing materials as a hole injecting layer, a hole injecting barrier is reduced and holes are efficiently injected.

As a typical example of the hole transporting layer 1012, known materials such as aromatic amine is a preferable example. For example, 4,4'-bis[N-(1-naphthyl)-N-phenyl-amino]-biphenyl (hereinafter, α-NPD), 4,4',4''-tris(N,N-diphenyl-amino)-triphenyl amine (hereinafter, TDATA), or the like can be used. As high molecular materials, poly(vinyl carbazole) having a good hole transportation property can be used.

A known material can be used for the electron transporting layer 1021. Specifically, a metal complex having a quinoline skeleton or a benzoquinoline skeleton, or a mixed ligand complex thereof as typified by tris(8-quinolinolate) aluminum complex (hereinafter, Alq$_3$) is preferably used. Alternatively, an oxadiazole derivative such as 2-(4-biphenyl)-5-(4-tert-butylphenyl)-1,3,4-oxadiazole (hereinafter, PBD), or 1,3-bis[5-(p-tert-butylphenyl)-1,3,4-oxadiazole-2-yl]benzene (hereinafter, OXD-7), a triazole derivative such as 3-(4-tert-butylphenyl)-4-phenyl-5-(4-biphenylyl)-1,2,4-triazole (hereinafter, TAZ), or 3-(4-tert-butylphenyl)-4-(4-ethylphenyl)-5-(4-biphenylyl)-1,2,4-triazole (hereinafter, p-EtTAZ), phenanthroline derivatives such as bathophenanthroline (hereinafter, BPhen), or bathocuproin (hereinafter, BCP) can be used.

The electron injecting layer 1022 can be formed by alkali metal, alkaline earth metal salt, or the like. Specifically, calcium fluoride, lithium fluoride, cesium bromide, or the like is nominated.

In the present invention, the second electrode 104 is formed over the electron injecting layer 1022. In this embodiment, metal having a small work function, alloy, an electric conductive compound, a mixture of the foregoing materials, or the like is used for the second electrode 104 since lower voltage is applied to the second electrode than that applied to the first electrode 103 in order to obtain light emission in this embodiment. Further, metal which has a weak to visible light absorption and large reflectivity is preferably used since a laser beam is emitted from the substrate 106 side in order to reduce loss of the beam as much as possible. Specifically, aluminum, magnesium, or alloy of the materials is preferably used. Since the cathode has preferably reflectivity of nearly 100%, the cathode is required to have a thickness which does not transmit visible light. Alternatively, a representative element belonging to the first group or the second group in the periodic table, that is, alkali metal such as lithium or cesium, alkali earth metal such as magnesium, calcium, or strontium, alloys including the foregoing materials, and transition metal including rare earth metal can be used. Further alternatively, the foregoing material can be used to be stacked over metal such as aluminum, silver, or ITO (including alloy) to form the second electrode 104.

With respect to the structure in which light emission is obtained by applying lower voltage to the first electrode 103 than that applied to the second electrode 104, the first electrode 103 is made from a material having a small work function and is formed to be a thin film so as to have large transmittance to a wavelength of oscillated laser light as much as possible. For example, the first electrode 103 has a thickness of approximate 5 to 20 nm in the case of using alloy of magnesium and silver. In that case, the second electrode 104 can be formed by a material having a large work function. Further, each layer interposed between the electrodes is stacked reversely. That is, assuming that the layers interposed between the electrodes have the same structure as that of this embodiment, an electron injecting layer, an electron transporting layer, a light-emitting layer, a hole transporting layer, and a hole injecting layer are stacked sequentially over the first electrode 103. Lastly, the second electrode 104 is stacked over the hole injecting layer.

The foregoing organic compound layer can be formed by either wet or dry process. In the case of using high molecular materials, spin coating, ink jetting, dip coating, printing, or the like can be appropriately used. On the other hand, in the case of using low molecular materials, not only dip coating or spin coating, but also vapor deposition can be used. The electrode material may be formed by vapor deposition, sputtering, or the like.

The light-emitting layer 100 is formed by a layer including a metal compound having a high refractive index and an organic material. A known material can be used as the organic material. For example, Alq$_3$, tris(4-methyl-8-quinolinolate) aluminum (hereinafter, Almq$_3$), bis(10-hydroxybenzo[η]-quinolinato)beryllium (hereinafter, BeBq$_2$), bis(2-methyl-8-quinolinolate)-(4-hydroxy-biphenylyl)-aluminum (hereinafter, BAlq), bis[2-(2-hydroxyphenyl)-benzooxazolate]zinc (hereinafter, Zn(BOX)$_2$), bis[2-(2-hydroxyphenyl)-benzothiazolate]zinc (hereinafter, Zn(BTZ)$_2$), or the like can be used. Alternatively, various types of fluorescent dye can be used. As the fluorescent dye, for example, coumarin pigment such as coumarin 102, coumarin 334, coumarin 6, coumarin 30, coumarin 545, or coumarin 545T, rhodamine pigment such as rhodamine B or rhodamine 6G, a stilbene derivative such as 4,4'-bis[2-(4-diphenylaminophenyl)vinyl]biphenyl (hereinafter, DPAVBi), 4,4'-bis(2,2-diphenylvinyl)biphenyl (hereinafter, DPVBi), 1,4-bis[2-(4-diphenylaminophenyl)vinyl]benzene (hereinafter, PAVB) can be nominated. Further, a phosphorescent material such as a platinum octaethylporphyrin complex, a tris(2-phenylpyridine)iridium complex, or a tris(benzylidene-acetonato) phenanthrene europium complex can be efficiently used. Since the phosphorescent material has longer excitation lifetime than that of a fluorescent material, inverted population, that is, the state in which the number of molecules in an excited state is larger that that in a ground state becomes to be formed easily, which is essential to laser oscillation.

In addition, a light-emitting material can be used as dopant in the foregoing light-emitting layer 100. Therefore, a material having larger ionization potential and a band gap than those of the light-emitting material can be used as a host material, and a small amount of the foregoing light-emitting material (approximately from 0.001 to 30%) can be mixed into the host material.

As a metal compound having high reflectivity, a bismuth oxide as typified by $Bi_2O_3$, a titanium oxide as typified by TiO, $Ti_2O_3$, $Ti_3O_5$, or $TiO_2$, a zirconium oxide as typified by $ZrO_2$, a tantalum oxide as typified by $Ta_2O_5$, a nickel oxide as typified by NiO, or a metal oxide such as a zinc oxide as typified by ZnO. Besides, metal sulfide such as ZnS or CdS can be used. Further, a compound oxide such as an indium tin oxide as typified by $In_2O_3$: $SnO_2$, or a zirconium titanium oxide as typified by $ZrO_2$: $TiO_2$. There are adverse effects that a refractive index is not sufficiently increased in the case that an amount of metal compound is too small and that resistance is excessively increased in the case that an amount of metal compound is too large. Therefore, a mol ratio between the all organic materials including the light-emitting material or hosts in the light-emitting layer, and all metal ions of the metal compound is preferably 0.01 or more and 100 or less, more preferably, 0.1 or more and 10 or less.

The light-emitting layer can be formed by co-evaporation of each material or by a wet method such as a sol-gel method. A metal compound capable of being deposited by resistance heating can be co-evaporated together with an organic material by resistance heating. In the case that the light-emitting layer 100 is made to include a metal compound which is difficult to be deposited by resistance heating such as a zirconium oxide or a titanium oxide, co-evaporation can be carried out by depositing an organic material by resistance heating simultaneously depositing a metal oxide by electron gun evaporation (EB evaporation) which emits an electron beam to an evaporation material to be evaporated. Further, the light-emitting layer according to the present invention can be formed by performing evaporation by resistance heating (deposition of an organic material) and sputtering (deposition of a metal oxide) in one chamber. A method for forming a light-emitting layer by a sol-gel method is hereinafter descried.

A thickness $d_e$ of the light-emitting layer 100 preferably corresponds to a distance of an integral multiple of a half wavelength in order to amplify light by forming a stationary wave. For example, an optical distance (refractive index× distance) of at least 200 nm is required in order to amplify light of 400 nm. Similarly, an optical distance of 400 nm is required in order to amplify light of 800 nm. An emission wavelength of the foregoing organic light-emitting material is presented mainly in a visible light region. Therefore, a thickness of a layer which constitutes a resonator structure, that is, an optical thickness (refractive index×thickness) of the light-emitting layer 100, is required to be 200 nm or more. Since it should consider that the speed of light is reduced by a refractive index, the value obtained by multiplying a thickness by a refractive index is required to be larger than 200 nm.

By applying current between electrodes of the laser equipment illustrated in FIG. 1, electrons injected from the second electrode 104 and holes injected from the first electrode 103 are recombined with each other within the light-emitting layer 100 in most. A part of the light emission which is obtained here is reflected within the light-emitting layer 100 to be amplified. Therefore, inverted population is formed by applying current at current density no less than a threshold value and laser is oscillated. In this embodiment, laser light is extracted from the first electrode 103 side. Laser light can be observed as a sharp emission spectrum centered on a wavelength which is allowed to be amplified in a resonator structure among spectra emitted from the light-emitting layer.

The laser equipment is manufactured by sealing the substrate 106 provided with the foregoing light-emitting element with an opposing substrate (not shown) and a sealing agent. The laser equipment can be either composed of one light-emitting element or a plurality of light-emitting elements.

Embodiment 2

In Embodiment 1, a structure in which laser light is extracted from a substrate 106 side, that is, a first electrode 103 side, is explained. In this embodiment, a structure in which laser light is extracted from a top face of a substrate, that is, a second electrode 104 side, is explained. In FIG. 1, reference numeral 106 denotes a substrate. Any material can be used for the substrate 106. Not only glass, quartz, and plastic, but also a flexible substrate such as paper or cloth can be used. Needless to say, these materials are not required to be transparent.

Reference numeral 103 denotes a first electrode. In this embodiment, a structure which can obtain light emission by applying voltage higher than that applied to another electrode is formed as with Embodiment 1. Therefore, the first electrode 103 can be formed by a material having a large work function (4.0 eV or more).

The structure in accordance with this embodiment emits laser beam from a second electrode 104 side, and so the first electrode 103 is preferably in the form of a reflective mirror. As a material which fulfills these conditions, silver, platinum, or gold can be used. In the case that the first electrode 103 is used as a reflective mirror, the first electrode 103 is required to have a thickness of from several tens of nanometers to several hundreds of nanometers which does not transmit visible light.

A structure which is the same as that of a light-emitting element employing a general organic material for each layer except for a light-emitting layer 100 can be formed over the first electrode 103. That is, a hole injecting layer 1011, a hole transporting layer 1012, and an electron transporting layer 1021 are formed. These layers can be formed by known materials as explained in Embodiment 1. Generally, an electron injecting layer 1022 is formed over the electron transporting layer 1021. As the electron injecting layer 1022, an organic compound doped with alkali metal such as lithium or cerium is preferably used. As the organic compound, an electron transporting material explained in Embodiment 1 can be used together.

The light-emitting layer 100 can be formed by a material having a structure as explained in Embodiment 1. The light-emitting layer 100 can be formed by have a thickness that fulfills $m\lambda/2n_e$ (m is an integer, $n_e$ is a refractive index of the light-emitting layer) assuming that a wavelength of a desired laser beam is $\lambda$.

Thereafter, the second electrode 104 is formed. The second electrode 104 can be formed by a known material as explained in Embodiment 1. Alternatively, MgAg alloy having a good electron injection property can be directly stacked without forming the electron injecting layer 1022. Since laser light is extracted from a top surface in this structure, the second electrode 104 is formed to have a cathode which is formed to be thin so that transmittance with respect to a wavelength of oscillated laser light becomes increased as much as possible. In the case of alloy of magnesium and silver, the cathode has a thickness of approximately 5 to 20 nm.

With respect to the structure in which light emission is obtained by applying lower voltage to the first electrode 103 than that applied to the second electrode 104, the first electrode 103 is formed by metal having a small work function, alloy, an electric conductive compound, and a mixture of these materials. Since a laser beam is emitted from the second electrode 104 side, metal which has a weak to visible light absorption and large reflectivity in order to reduce loss of the beam as much as possible. Specifically, aluminum, magnesium, or alloy of these materials is preferably used. Since it is preferable that reflectivity is almost 100% in the cathode, the cathode is required to have a thickness which does not transmit visible light. Besides, a representative element belonging to the first group or the second group in the periodic table, that is, alkali metal such as lithium or cesium, alkali earth metal such as magnesium, calcium, or strontium, alloys including the foregoing materials, and transition metal including rare earth metal can be used. Alternatively, the foregoing material can be used to be stacked over metal such as aluminum, silver, or ITO (including alloy) to form the first electrode 103. Further, the second electrode 104 can be formed by a material having a large work function. Since a laser beam is extracted from the second electrode 104, the second electrode 104 is preferably transparent as much as possible. In the case of metal or alloy, it is preferable that metal which has a weak to visible light absorption is used to be formed into a thin film. In the case of metal or alloy, metal having a weak to absorption in a visible light region is used and is formed to be a thin film. As the second electrode 104, a transparent conductive oxide or nitride such as an indium tin oxide (ITO), a zinc oxide (ZnO), or a titanium oxide (TiN) can be used. However, these materials absorb light to some extent, and so the electrode is preferably formed to be a thin film having a thickness of approximate 1000 nm or less. Further, each layer interposed between the electrodes is required to be stacked reversely. That is, assuming that the layers interposed between the electrodes have the same structure as that of this embodiment, an electron injecting layer, an electron transporting layer, a light-emitting layer, a hole transporting layer, and a hole injecting layer are stacked sequentially over the first electrode 103. Lastly, the second electrode 104 is stacked over the hole injecting layer.

By applying current between electrodes of the laser equipment in accordance with this embodiment, light amplified by induced radiation resonates within the light-emitting layer 100 and laser light can be extracted from a top surface of a light-emitting element (second electrode 104 side).

Laser equipment is manufactured by sealing the substrate 106 provided with the foregoing light-emitting element with an opposing substrate (not shown) and a sealing agent. As the opposing substrate, a substrate having a light-transmitting property is used in order to extract light emission from the second electrode 104 side. Specifically, glass, quartz, transparent plastic, or the like can be used. The laser equipment can be either composed of one light-emitting element or a plurality of light-emitting elements.

Embodiment 3

In this embodiment, a laser oscillator having a double amplification structure in which a laser beam which is amplified in a light-emitting layer is emitted, the emitted laser beam is reflected by an electrode, the reflected laser beam is returned to the light-emitting layer, and the returned laser beam is further amplified in the light-emitting layer is explained.

In this embodiment, the same structure as that in Embodiments 1 and 2 is employed. A distance between the light-emitting layer and the electrode is defined.

In the present invention, a refractive index of the light-emitting layer is made to be higher than those of the other functioning layers (a hole injecting layer, a hole transporting layer, an electron transporting layer, and the like) which are in contact with the light-emitting layer by means of including a metal oxide having a high refractive index. Therefore, light which is emitted due to current excitation within the light-emitting layer is resonance in the light-emitting layer and is amplified to yield laser oscillation. However, a laser beam which leaks to the second electrode results in a loss in the case of a laser oscillator having a structure in which laser is emitted to a first electrode. Even if a laser beam emits to the first electrode side, it cannot say that there is no laser beam reflected by an interface of the electrode, consequently, the reflected laser beam results in a loss.

In this embodiment, the distance from the light-emitting layer to the electrode is set to fulfill $(2m-1)\lambda/(4n)$ (m is an integer of 1 or more, n is a refractive index of a functioning layer) assuming that a wavelength of a desired laser beam is $\lambda$.

Here, reflection by an interface between the light-emitting layer and functioning layers which interpose the light-emitting layer therebetween is considered. Since a refractive index of the light-emitting layer is larger than that of the functioning layer in the present invention, light reflection toward the functioning layer from the light-emitting layer is free end reflection. On the other hand, in the case that light passing through the functioning layer is reflected by an electrode, the light reflection is fixed end reflection since a refractive index of the electrode is extremely higher than that of the functioning layer. There is a phase lag between a reflected wave due to the free end reflection and an incident wave. However, there is a $\pi$ phase lag between a reflected wave due to the fixed end reflection and an incident wave. In view of the foregoing, the condition of reinforcing when a reflected wave by the electrode is entered to the light-emitting layer is that a distance d between the light-emitting layer and the functioning layer fulfills $(2m-1)\lambda/(4n_f)$ (m is an integer of 1 or more, $n_f$ is a refractive index of a functioning layer). In the case that a plurality of functioning layers made from different materials is presented between the light-emitting layer and the electrode, sum of the value obtained by multiplying a refractive index of each functioning layer by thickness ratio of the functioning layer can be appropriately used assuming that a distance in which the functioning layer is presented between the light-emitting layer and the electrode is 1.

The distance between the light-emitting layer and the electrode is preferably defined at both sides of the light-emitting layers; however, distance definition can be provided at either the electrode side.

In the case that an electrode having a light-transmitting property is used as the electrode, the electrode is desired to be formed to fulfill $m\lambda/(2n_t)$ (m is an integer of 1 or more, $n_t$ is a refractive index of an electrode) in the case that the refractive index nt is higher than that of a layer being in contact with one surface of the electrode, which is opposite to another side provided with the light-emitting layer, and fulfills $(2m-1)\lambda/(4n_t)$ (m is an integer of 1 or more, nt is a refractive index of an electrode).

A laser oscillator having such the structure can further efficiently oscillate laser.

This embodiment is desirably combined to Embodiment 1 or 2.

Embodiment 4

In this embodiment, a structure of laser equipment capable of extracting laser light from an edge face (edge portion) is described.

Figure 3:
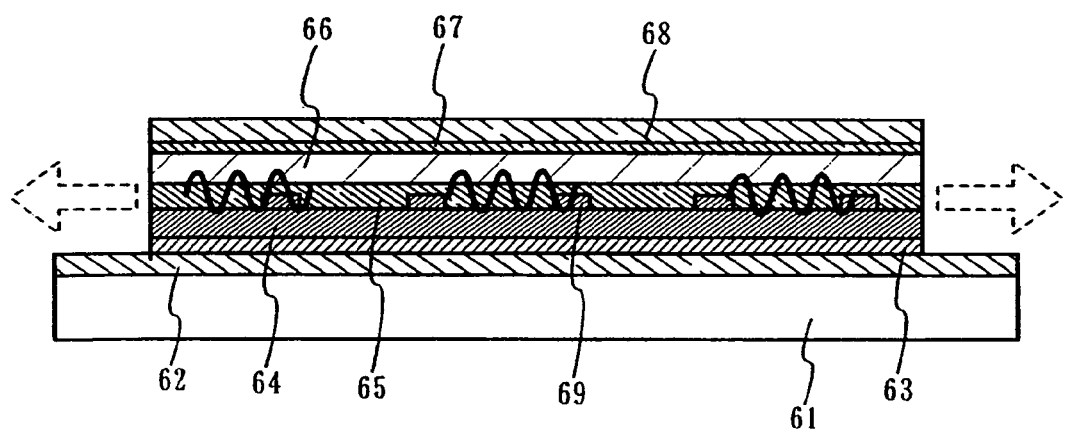
FIG. 3 is a cross-sectional schematic view of a laser oscillator according to the present invention.

In FIG. 3, a material for a substrate 61 is not especially selected. A material described in Embodiment 2 can be used for the substrate 61. A first electrode 62 is formed over the substrate 61. Here, a light emission component which is parallel to a film surface, that is, a longitudinal mode, is only attracted attention with respect to light amplification due to resonance, and so resonance of light emission component (transverse mode) as shown in Embodiment 1 or 2 can be ignored. Therefore, transparency or reflectivity of an electrode can be ignored; accordingly, a work function can be selected as a main parameter. However, an electrode which has no transparency is preferable in consideration of light penetrating into a direction perpendicular to a substrate.

The same structure as that of a light-emitting element employing an organic material for layers except for a light-emitting layer 65 which exhibits light emission by being applied with current is provided over the first electrode 62. That is, a hole injecting layer 63, a hole transporting layer 64, an electron transporting layer 66, and an electron injecting layer 67 are provided, each of which is formed by selecting a material and a method as explained in Embodiment 1. Further, these organic compound layers and the electrode can be formed to have thicknesses selected to emit light efficiently. A second electrode 67 is formed over the electron injecting layer 67.

Laser is oscillated from an edge surface between the electrodes, or the substrate in this embodiment. Therefore, a width between the electrodes can be small. It is sufficient that the width between the electrodes is several micro millimeters and a length between the electrodes is several hundreds micro millimeters. The important thing is control of a plurality of longitudinal modes. In the case that the laser is oscillated from a transverse direction between the electrodes, a wavelength is shorter than a length between the electrodes, and so many longitudinal modes are generated. As a result, a number of longitudinal modes are entered into a spectrum shape curved line. In view of this, diffraction grating 69 is manufactured at the vicinity of the light-emitting layer as shown in FIG. 3. For example, a top surface of the hole transporting layer is formed not to be smooth but strip-shaped to form the diffraction grating. Accordingly, light generated within the light-emitting layer is periodically reflected by grid intervals of the diffraction grating to be resonated and amplified. Hence, light having a high monochromatic property can be amplified. Assuming that a refractive index of the light-emitting layer is n and a wavelength to be oscillated is λ, diffraction grating (λ/2n) can be manufactured.

Thus, a single longitudinal mode can be realized and laser light having a high monochromatic property can be obtained from a side face of an organic compound layer.

Embodiment 5

A method for forming a light-emitting layer in a semiconductor device according to the present invention by a wet method is explained in this embodiment.

Firstly, a method for forming a light-emitting layer 100 by a sol-gel method with alkoxide is explained. In this embodiment, a light-emitting layer containing a metal oxide among metal compounds described in Embodiment 1 can be formed. Alcoxide of metal in a metal oxide which is hoped to be included in the light-emitting layer 100 is prepared. In addition, another metal alcoxide can be added in the case of using a plurality of kinds of metal compounds.

Sol is prepared by adding a chelating agent such as β-diketone as a stabilizer and water to alkoxide solution obtained by dissolving the alkoxide with appropriate solvent. THF, acetonitrile, dichloromethane, dichloroethane, or mixed solvent of these materials can be, but not exclusively, used as the solvent besides lower alcohol such as methanol, ethanol, n-propanol, i-propanol, n-butanol, or sec-butanol.

For example, acetylacetone, ethyl acetoacetate, benzoylacetone, or the like can be nominated as an example of a compound which can be employed as the stabilizer. However, the stabilizer is used for preventing precipitation in the sol, and is not necessarily required.

As an amount of adding water is preferably 2 equivalent weight or more and 6 equivalent weight or less with respect to alkoxide of metal since valency of metal of alkoxide is 2 to 6. Note that water is used to control a rate at which the reaction of metal alkoxide proceeds, and is not necessarily required.

Solution of an organic material as explained in Embodiment 1 used for a light-emitting layer 100 is prepared, the solution is mixed into the prepared sol, and the mixed solution is stirred. Accordingly, mixed solution containing alkoxide of metal and an organic material is obtained. Thereafter, the solution is coated and baked to form a film used as the light-emitting layer 100 of a light-emitting element in a laser oscillator according to the present invention. As a method for coating the mixed solution, a wet method such as a dip coating method, a spin coating method, or an ink jet method can be, but not exclusively, used.

In the case that molecular weight of the organic material is small (specifically, a compound having molecular weight of 500 or less), film quality can be improved by adding a binder substance to the mixed solution. Of course, the binder substance can be added in the case of using a high molecular compound as the organic material. In the case of adding the binder substance to the mixed solution, the binder substance can be preliminarily added to metal alkoxide solution in either case. As the binder substance, polyvinyl alcohol (abbreviated as PVA), polymethyl methacrylate (abbreviated as PMMA), polycarbonate (abbreviated as PC), phenol resin, or the like can be nominated.

Alkoxide solution without being added with water is mixed to solution of an organic material as shown in Embodiment 1 used for the light-emitting layer 100, the mixed solution is coated, exposed to water vapor, and baked. Then, a film used for the light-emitting layer 100 of a light-emitting element in the laser oscillator according to the present invention can be formed. Hydrolysis reaction is occurred by exposing the coated solution to water vapor. Then, the exposed solution is baked, and then, polymerization or cross-linking is proceeded to form a layer containing a metal oxide and an organic material.

In the case of carrying out hydrolysis reaction with the foregoing water vapor, a stabilizer can be added to solution containing alkoxide of metal and an organic material. By adding the stabilizer, polynuclear precipitation of hydroxide of the first metal due to moisture in the atmosphere or the like can be restrained. Further, the stabilizer is not necessarily required if the foregoing process is carried out without moisture until exposing to water vapor.

A method for forming a film used as the light-emitting layer 100 of a light-emitting element in the laser oscillator according to the present invention by a sol-gel method which is different from that with the foregoing alkoxide is explained. A film containing a metal oxide and an organic material can also be formed by this method.

Firstly, ammonia solution is dropped to solution of acid salt including metal in a metal oxide which is to be included in the light-emitting layer 100, then, polynuclear precipitation of hydroxide of the metal is obtained. In the case that a plurality kinds of metal oxides is made to be included in the light-emitting layer 100, the metal salt can be added thereto.

Acid such as acetic acid is added to the obtained precipitation to be refluxed. Peptization is occurred and sol can be obtained. Solution of an organic material (or an organic material) used for a light-emitting layer is added to the obtained sol, and the solution is stirred. Accordingly, sol of metal and the first solution containing an organic material can be obtained. Thereafter, a film used as the light-emitting layer 100 of a light-emitting element in the laser oscillator according to the present invention can be formed by coating and baking the first solution. As a method for coating the first solution, a wet method such as a dip coating method, a spin coating method, or an ink jet method can be, but not exclusively, used.

A binder substance can be preliminarily added to the first solution in the case of forming the light-emitting layer by adding the binder substance.

This application is based on Japanese Patent Application serial no. 2004-353451 filed in Japan Patent Office on 2004/12/06 the contents of which are hereby incorporated by reference.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A laser oscillator comprising:
   a first electrode over a substrate;
   a first layer comprising a first organic material over the first electrode;
   a second layer comprising a second organic material on the first layer, the second organic material comprising at least a light-emitting material;
   a third layer comprising a third organic material on the second layer; and
   a second electrode over the third layer;
   wherein the second layer further comprises a metal sulfide.

2. A laser oscillator comprising:
   a first electrode over a substrate;
   a first layer comprising a first organic material over the first electrode;
   a second layer comprising a second organic material on the first layer, the second organic material comprising at least a light-emitting material;
   a third layer comprising a third organic material on the second layer; and
   a second electrode over the third layer;
   wherein the second layer further comprises a metal sulfide; and
   wherein a thickness $d_e$ of the second layer fulfills $d_e = m\lambda/2n_e$ (m is an integer of 1 or more) assuming that a refractive index of the second layer is $n_e$.

3. The laser oscillator according to claim 1, wherein the metal sulfide is at least one selected from the group consisting of ZnS and CdS.

4. The laser oscillator according to claim 1, wherein the first layer includes at least one of a hole injecting layer and a hole transporting layer, and the third layer includes at least one of an electron transporting layer and an electron injecting layer.

5. The laser oscillator according to claim 1, wherein the first layer includes at least one of an electron transporting layer and an electron injecting layer, and the third layer includes at least one of a hole injecting layer and a hole transporting layer.

6. The laser oscillator according to claim 1, wherein the substrate and the first electrode have transparency.

7. The laser oscillator according to claim 1, wherein a light-emitting element comprising the first, second, and third layers, and the first and second electrodes are sealed with an opposing substrate, and the opposing substrate and the second electrode have transparency.

8. The laser oscillator according to claim 1, wherein each thickness $d_f$ of each of the first layer and/or the second layer fulfills $d_f = (2m-1)\lambda/4n_f$ assuming that each refractive index is $n_f$.

9. A laser oscillator comprising:
   a first electrode over a substrate;
   an electron injecting and transporting layer over the first electrode;
   a light-emitting layer on the electron injecting and transporting layer, the light-emitting layer comprising at least a light-emitting material;
   a hole injecting and transporting layer on the light-emitting layer; and
   a second electrode over the hole injecting and transporting layer;
   wherein the light-emitting layer further comprises a metal sulfide; and
   wherein a thickness $d_e$ of the light-emitting layer fulfills $d_e = m\lambda/2n_e$ (m is an integer of 1 or more) assuming that a refractive index of the light-emitting layer is $n_e$.

10. A laser oscillator comprising:
    a first electrode over a substrate;
    a hole injecting layer over the first electrode;
    a hole transporting layer over the hole injecting layer;
    a light-emitting layer comprising an organic material on the hole transporting layer, the organic material comprising at least a light-emitting material;
    an electron transporting layer on the light-emitting layer;
    an electron injecting layer over the electron transporting layer;
    a second electrode over the electron injecting layer;
    wherein the light-emitting layer further comprises a metal sulfide; and
    wherein a thickness $d_e$ of the light-emitting layer fulfills $d_e = m\lambda/2n_e$ (m is an integer of 1 or more) assuming that a refractive index of the light-emitting layer is $n_e$.

11. The laser oscillator according to claim 2, wherein the metal sulfide is at least one selected from the group consisting of ZnS and CdS.

12. The laser oscillator according to claim 2, wherein the first layer includes at least one of a hole injecting layer and a hole transporting layer, and the third layer includes at least one of an electron transporting layer and an electron injecting layer.

13. The laser oscillator according to claim 2, wherein the first layer includes at least one of an electron transporting layer and an electron injecting layer, and the third layer includes at least one of a hole injecting layer and a hole transporting layer.

14. The laser oscillator according to claim 2, wherein the substrate and the first electrode have transparency.

15. The laser oscillator according to claim 2, wherein a light-emitting element comprising the first, second, and third layers, and the first and second electrodes are sealed with an opposing substrate, and the opposing substrate and the second electrode have transparency.

16. The laser oscillator according to claim 2, wherein each thickness $d_f$ of each of the first layer and/or the second layer fulfills $d_f=(2m-1)\lambda/4n_f$ assuming that each refractive index is $n_f$.

17. The laser oscillator according to claim 9, wherein the substrate and the first electrode have transparency.

18. The laser oscillator according to claim 9, wherein a light-emitting element comprising the electron injecting and the transporting, the light-emitting, and the electron transporting layers, and the first and second electrodes are sealed with an opposing substrate, and the opposing substrate and the second electrode have transparency.

19. The laser oscillator according to claim 9, wherein each thickness $d_f$ of each of the electron injecting and transporting layer, and the light-emitting layer fulfills $d_f=(2m-1)\lambda/4n_f$ assuming that each refractive index is $n_f$.

20. The laser oscillator according to claim 10, wherein the substrate and the first electrode have transparency.

21. The laser oscillator according to claim 10, wherein a light-emitting element comprising the hole injecting layer, the hole transporting layer, the light-emitting layer, the electron transporting layer, and the electron injecting layer, and the first and second electrodes are sealed with an opposing substrate, and the opposing substrate and the second electrode have transparency.

22. The laser oscillator according to claim 10, wherein each thickness $d_f$ of each of the hole injecting layer, the hole transporting layer, and the light-emitting layer fulfills $d_f=(2m-1)\lambda/4n_f$ assuming that each refractive index is $n_f$.

* * * * *